United States Patent [19]
Yamauchi

[11] Patent Number: 6,127,950
[45] Date of Patent: Oct. 3, 2000

[54] TRANSMISSION CIRCUIT AND RECEPTION CIRCUIT

[75] Inventor: Hiroyuki Yamauchi, Osaka, Japan

[73] Assignee: Matsushita Electric Industrial Co., Ltd., Osaka, Japan

[21] Appl. No.: 09/244,764

[22] Filed: Feb. 5, 1999

[30] Foreign Application Priority Data

Feb. 16, 1998 [JP] Japan .................................. 10-032635

[51] Int. Cl.$^7$ .................................................... H03M 7/00
[52] U.S. Cl. .............................................. 341/55; 341/51
[58] Field of Search .................................. 341/51, 55, 87, 341/63; 710/65, 66, 68; 712/225, 300

[56] References Cited

U.S. PATENT DOCUMENTS

| | | | |
|---|---|---|---|
| 3,976,844 | 8/1976 | Betz | 375/240 |
| 4,796,003 | 1/1989 | Bentley et al. | 341/95 |
| 4,899,148 | 2/1990 | Sato et al. | 341/65 |
| 5,384,568 | 1/1995 | Grinberg et al. | 341/51 |
| 5,475,831 | 12/1995 | Yoshida et al. . | |
| 5,572,736 | 11/1996 | Curran . | |
| 5,574,921 | 11/1996 | Curan . | |
| 5,847,666 | 12/1998 | Yasohima et al. . | |

FOREIGN PATENT DOCUMENTS

| | | |
|---|---|---|
| 57-6940 | 1/1982 | Japan . |
| 2-310762 | 12/1990 | Japan . |
| 5-135187 | 6/1993 | Japan . |

*Primary Examiner*—Howard L. Williams
*Attorney, Agent, or Firm*—Eric J. Robinson; Nixon Peabody LLP

[57] ABSTRACT

Image data is transmitted from a memory to a CPU (central processing unit). A transmission circuit of the memory receives an 8-bit source parallel signal, makes reference to transmission histories or to transmission predictions to generate a 2-bit coded parallel signal from the source parallel signal, and sends a serial signal as a result of converting the coded parallel signal, together with a flag signal indicative of the presence of an encoding. If the source parallel signal remains unchanged, the coded parallel signal is made to indicate 00 so that the bit transition probability of the serial signal is reduced. A reception circuit of the CPU receives the serial and flag signals and restores the 8-bit source parallel signal on the basis of reception histories or on the basis of reception predictions. If the transmission circuit fails in performing an encoding, then a serial signal as a result of directly converting the source parallel signal is sent together with a flag signal indicative of the absence of an encoding.

22 Claims, 8 Drawing Sheets

TRANSMISSION CIRCUIT AND RECEPTION CIRCUIT

BACKGROUND OF THE INVENTION

This invention relates to transmission and reception circuits, and particularly relates to transmission and reception circuits for the achievement of information transfer by means of serial signals between semiconductor integrated circuits each performing internal handling of parallel signals.

A recent tremendous increase in the processing amount of moving-picture data requires a high-speed information transfer between semiconductor integrated circuits mounted on a single printed wiring board. One such example of a high-speed information transfer is a transfer of information between a CPU (central processing unit) and a memory by the use of signals such as data signals, address signals, and other control signals. The unit, at which parallel signals are processed in semiconductor integrated circuits, has been increased year by year, and the width of internal buses is now changing to 64 bits and further to 128 bits.

Japanese Unexamined Laid-Open Application Publication No. 2-310762 shows a technique intended for avoiding the problem of noise resulting from simultaneous switchings of a large number of signals occurring at the time of transmitting parallel signals between semiconductor integrated circuits. In the 2-310762 technique, when a first parallel signal, which has been sent onto the external data bus, is switched to a second parallel signal, the second parallel signal is polarity determined such that the number of bits that change is reduced to less than half the total number of bits and a 1-bit signal relating to the polarity determined is transmitted along with the second parallel signal. This 2-310762 technique makes it possible to constantly hold the number of bits that change at the same time on the bus below half the total bit number.

U.S. Pat. No. 5,572,736 also shows a technique for providing a solution to the aforesaid noise problem occurring in transferring parallel signals, wherein data words are transmitted on the bus in the form of code words. The code words are formulated such that the number of bits of the bus which changes with the transmission of successive code words is minimized. The U.S. Pat. No. 5,572,736 technique performs a parallel signal transmission by the use of a code word generated from a data word and a switching code for designating a data word-into-code word mapping.

However, the parallel signal transmission requires numerous signal lines that have to be laid out in a confined space of the printed wiring borad, therefore imposing practical constraints upon the number of external bus bits for the transmission of parallel signals. If a by-pass technique, in which some signal wires are by-passed, is employed, this prevents the implementation of equal-length wiring, therefore giving rise to the problem that there is produced a difference in delay between signal lines.

To cope with such a problem, it has been considered to employ a serial signal transmission technique serving in place of the foregoing parallel signal transmission technique. A parallel-serial converter is disposed in one semiconductor integrated circuit at the transmission end and a serial-parallel converter is disposed in another semiconductor integrated circuit at the reception end, whereby information transfer can be performed in a serial fashion between the semiconductor integrated circuits. For instance, if parallel-serial conversion and serial-parallel conversion are carried out in units of eight bits, this means that the number of signal lines (i.e. the number of external bus bits) necessary for the transfer of information can be reduced to one eighth. This therefore makes it possible to achieve the provision of equal-length wiring on a printed wiring board with ease.

In the above-described serial signal transmission technique, parallel signals are directly (without modification) converted into serial signals. If internal parallel data (for example, 8-bit internal parallel data of 10101010) is repeatedly transmitted many times, there must always be made bit transitions reciprocating between 1 and 0 in serial signals. Assuming here that M is an integer equal to or greater than 2, the bit transition robability (BTP) at the time of transmitting a serial signal of bits is defined as follow.

$$BTP = m/(M-1)$$

where the denominator $M-1$ indicates the number of possible bit transitions and the numerator $m$ indicates the number of bit transitions that have actually occurred. The number $m$ is an integer equal to or greater than 0 and equal to or less than $M-1$. For example, a serial signal corresponding to the foregoing 8-bit data of 10101010 has a BTP of $7/7=1$. Even when code words and switching codes, previously described, are employed, the serial signal also has a BTP of 1 if a code word obtained by mapping is 10101010.

The increase of the serial signal BTP gives rise to various drawbacks. For example, if the clock rate is increased too much for the realization of higher-speed information transfer rates, this results in the following problems. One problem is that there is produced an increase in electric power that is consumed. Another problem is that the effect of reflection due to inductance components of a signal line significantly appears in the waveform of a serial signal, as a result of which the change in the voltage level of the serial signal becomes unable to follow up a bit transition. In other words, the voltage level of serial signals is lowered on the way to move upward to the level of logical 1 or is increased on the way to move downward to the level of logical 0, and signal transmission errors occur. For this reason, conventional techniques fail to provide satisfactory high-speed information transfer rates.

SUMMARY OF THE INVENTION

Accordingly, an object of the present invention is to provide transmission and reception circuits for the achievement of information transfer by means of a serial signal low in bit transition probability between semiconductor integrated circuits each performing internal handling of parallel signals.

Another object of the present invention is to provide transmission and reception circuits for the achievement of high-speed information transfer by means of a serial signal between semiconductor integrated circuits each performing internal handling of parallel signals.

In order to accomplish these objects, in the present invention a coded parallel signal is generated from a parallel signal (a source parallel signal) carrying information to be transferred, making reference to transmission histories or to transmission predictions at the transmission end. The coded parallel signal thus generated is parallel-serial converted. At the reception end, the information is restored making reference to reception histories or to reception predictions.

From a standpoint of the present invention, a coded parallel signal generated is representative of the relationship between one parallel signal that has already been transmission processed and a source parallel signal and is a signal containing therein adjacent bits identical in value with each other. Because of this, the bit transition probability of transmission serial signals is reduced.

From another standpoint of the present invention, a coded parallel signal generated is representative of the relationship between one parallel signal that has already been transmission processed and is a signal made up of a less number of bits than the source parallel signal. The present invention was made by giving attention to the fact that there exists a correlation in time axis direction between source parallel signals in many cases. Accordingly, information compression can be carried out so as to eliminate the redundancy of the information to be transferred.

The present invention provides a first transmission circuit, disposed in a first semiconductor integrated circuit, for the achievement of information transfer by means of a serial signal between the first semiconductor integrated circuit and a second semiconductor integrated circuit, each of the first and second semiconductor integrated circuits performing internal handling of parallel signals. The first transmission circuit of the present invention employs a configuration comprising (a) input means for receiving a source parallel signal from the inside of the first semiconductor integrated circuit, (b) first conversion means for converting the source parallel signal into a first serial signal, (c) encode means for making an attempt to generate a coded parallel signal which represents the relationship between one parallel signal which has already been transmission processed and the source parallel signal and which contains therein adjacent bits identical in value with each other, and generating a flag signal which provides an indication of the presence of an encoding if the attempt was successful and which otherwise provides an indication of the absence of an encoding, (d) second conversion means for converting the coded parallel signal into a second serial signal, and (e) transmission selection means for selecting the first serial signal if the flag signal is indicative of the absence of an encoding, and selecting the second serial signal if the flag signal is indicative of the presence of an encoding. The first serial signal or the second serial signal, whichever was selected by the transmission selection means, is transmitted to the second semiconductor integrated circuit, together with the flag signal generated in the encode means.

The present invention provides, in an associated fashion with the first transmission circuit, a first reception circuit which is disposed, for the achievement of information transfer by means of a serial signal between first and second semiconductor integrated circuits each performing internal handling of parallel signals, in the second semiconductor integrated circuit so as to receive from the first semiconductor integrated circuit the serial signal together with a flag signal which provides an indication of the presence or absence of an encoding of the serial signal. The first reception circuit of the present invention employs a configuration comprising (a) first conversion means for converting the serial signal received together with the flag signal indicative of the absence of an encoding, into a source parallel signal, (b) second conversion means for converting the serial signal received together with the flag signal indicative of the presence of an encoding, into a coded parallel signal having adjacent bits identical in value with each other, (c) decode means for generating from the coded parallel signal a regenerated parallel signal, (d) reception selection means for selecting the source parallel signal if the flag signal is indicative of the absence of an encoding, and selecting the regenerated parallel signal if the flag signal is indicative of the presence of an encoding, and (e) output means for providing the source parallel signal or the regenerated parallel signal, whichever was selected by the reception selection means, to the inside of the second semiconductor integrated circuit.

By virtue of the first transmission circuit and the first reception circuit, adjacent bits are equalized making reference to transmission histories or to transmission predictions and a parallel signal as a result of such encoding is subjected to parallel-serial conversion, which can provide reductions in serial signal bit transition probability. Even when encoding is carried out with failure, it is arranged such that a result, obtained by parallel-serial converting a source parallel signal, is transmitted/received. This makes it possible to assure, at the worst, the same bit transition probability as a conventional technique.

The present invention provides a second transmission circuit, disposed in a first semiconductor integrated circuit, for the achievement of information transfer by means of a serial signal between the first semiconductor integrated circuit and a second semiconductor integrated circuit, each of the first and second semiconductor integrated circuits performing internal handling of parallel signals. The second transmission circuit of the present invention employs a configuration comprising (a) input means for receiving a source parallel signal from the inside of the first semiconductor integrated circuit, (b) first conversion means for converting the source parallel signal into a first serial signal, (c) encode means for making an attempt to generate a coded parallel signal which represents the relationship between one parallel signal which has already been transmission processed and the source parallel signal and which is made up of a less number of bits than the source parallel signal, and generating a flag signal which provides an indication of the presence of an encoding if the attempt was successful and which otherwise provides an indication of the absence of an encoding, (d) second conversion means for converting the coded parallel signal into a second serial signal, and (e) transmission selection means for selecting the first serial signal if the flag signal is indicative of the absence of an encoding, and selecting the second serial signal if the flag signal is indicative of the presence of an encoding. The first serial signal or the second serial signal, whichever was selected by the transmission selection means, is transmitted to the second semiconductor integrated circuit, together with the flag signal generated in the encode means.

The present invention provides, in an associated fashion with the second transmission circuit, a second reception circuit which is disposed, for the achievement of information transfer by means of a serial signal between first and second semiconductor integrated circuits each performing internal handling of parallel signals, in the second semiconductor integrated circuit so as to receive from the first semiconductor integrated circuit the serial signal together with a flag signal which provides an indication of the presence or absence of an encoding of the serial signal. The second reception circuit of the present invention employs a configuration comprising (a) first conversion means for converting the serial signal received together with the flag signal indicative of the absence of an encoding, into a source parallel signal, (b) second conversion means for converting the serial signal received together with the flag signal indicative of the presence of an encoding, into a coded parallel signal made up of a less number of bits than the source parallel signal, (c) decode means for generating from the coded parallel signal a regenerated parallel signal made up of the same number of bits as the source parallel signal, (d) reception selection means for selecting the source parallel signal if the flag signal is indicative of the absence of an encoding, and selecting the regenerated parallel signal if the flag signal is indicative of the presence of an encoding, and (e) output means for providing the source parallel signal or the regenerated parallel signal, whichever was selected by the reception selection means, to the inside of the second semiconductor integrated circuit.

By virtue of the second transmission circuit and the second reception circuit, information compression is performed referring to transmission histories or to transmission predictions so as to eliminate the redundancy of the information to be transferred and a parallel signal as a result of such encoding is subjected to parallel-serial conversion. This can considerably increase the amount of information transferable per unit time in comparison with conventional information transfer techniques. Even when encoding is carried out with failure, it is arranged such that a result, obtained by parallel-serial converting a source parallel signal, is transmitted/received. This makes it possible to assure, at the worst, the same information transfer rate as a conventional technique.

DETAILED DESCRIPTION OF THE INVENTION

Preferred embodiments of the present invention will be described below with reference to the accompanying drawing figures.

Figure 1:
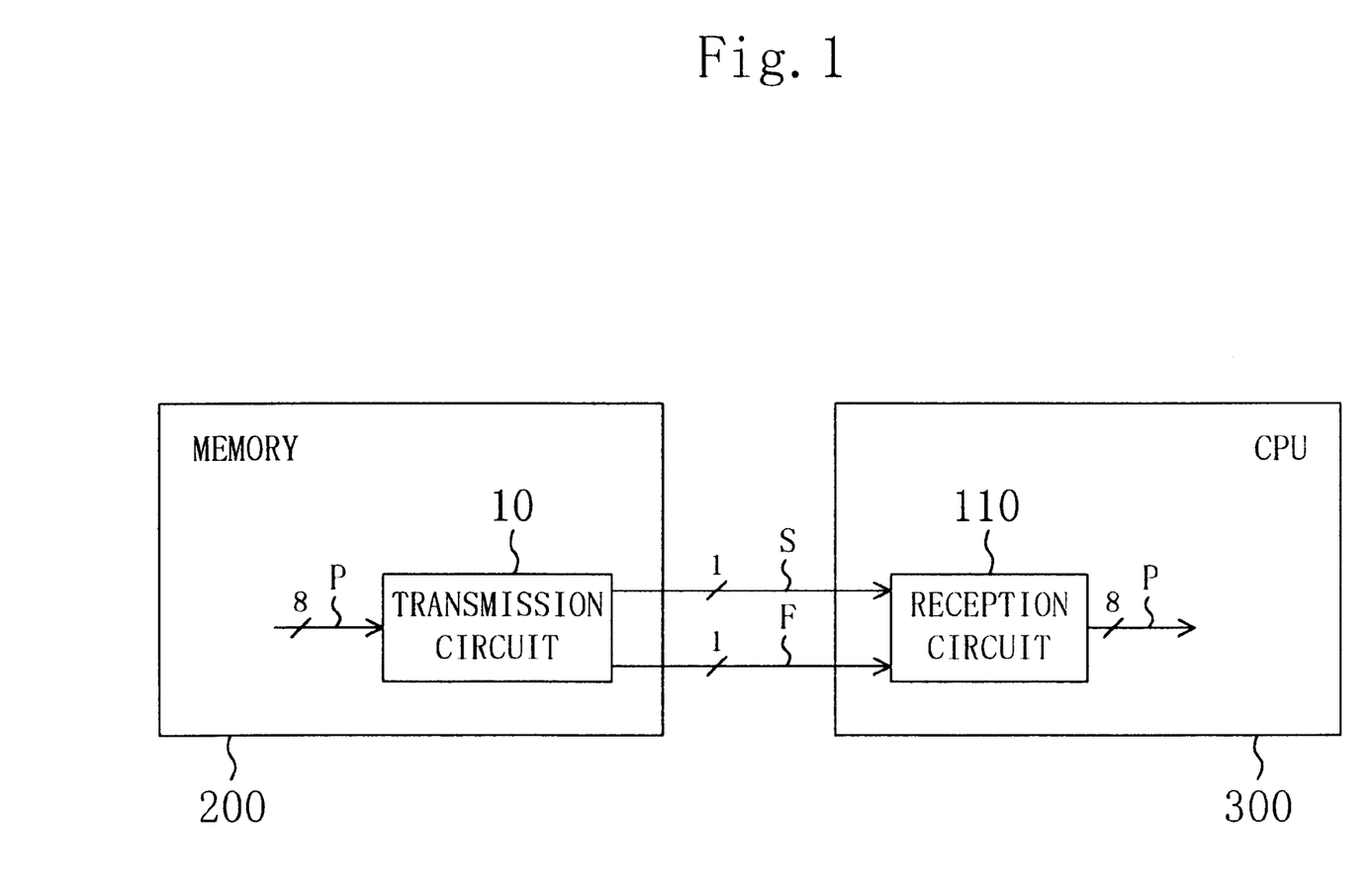
FIG. 1 is a block diagram illustrating an example application of the combination of a transmission and a reception circuit of the present invention.

FIG. 1 shows an example in which the present invention is applied to the transmission of image data from a memory to a CPU. 200 represents a memory. 300 represents a CPU. The memory 200 is formed by a semiconductor integrated circuit operable to internally handle 8-bit parallel signals. Like the memory 200, the CPU 300 is formed by a semiconductor integrated circuit operable to internally handle 8-bit parallel signals. The memory 200, which stores one frame of image data, has a transmission circuit 10. The CPU 300, which controls the process of the 1-frame image data, has a reception circuit 110. The transmission circuit 10 receives a source parallel signal P of eight bits from the inside of the memory 200 and sends a serial signal S and a flag signal F which provides an indication of the presence or absence of an encoding in the serial signal S. The reception circuit 110 receives these signals S and F from the transmission circuit 10. In the reception circuit 110, the original 8-bit source parallel signal P is restored for forwarding to the inside of the CPU 300.

Figure 2:
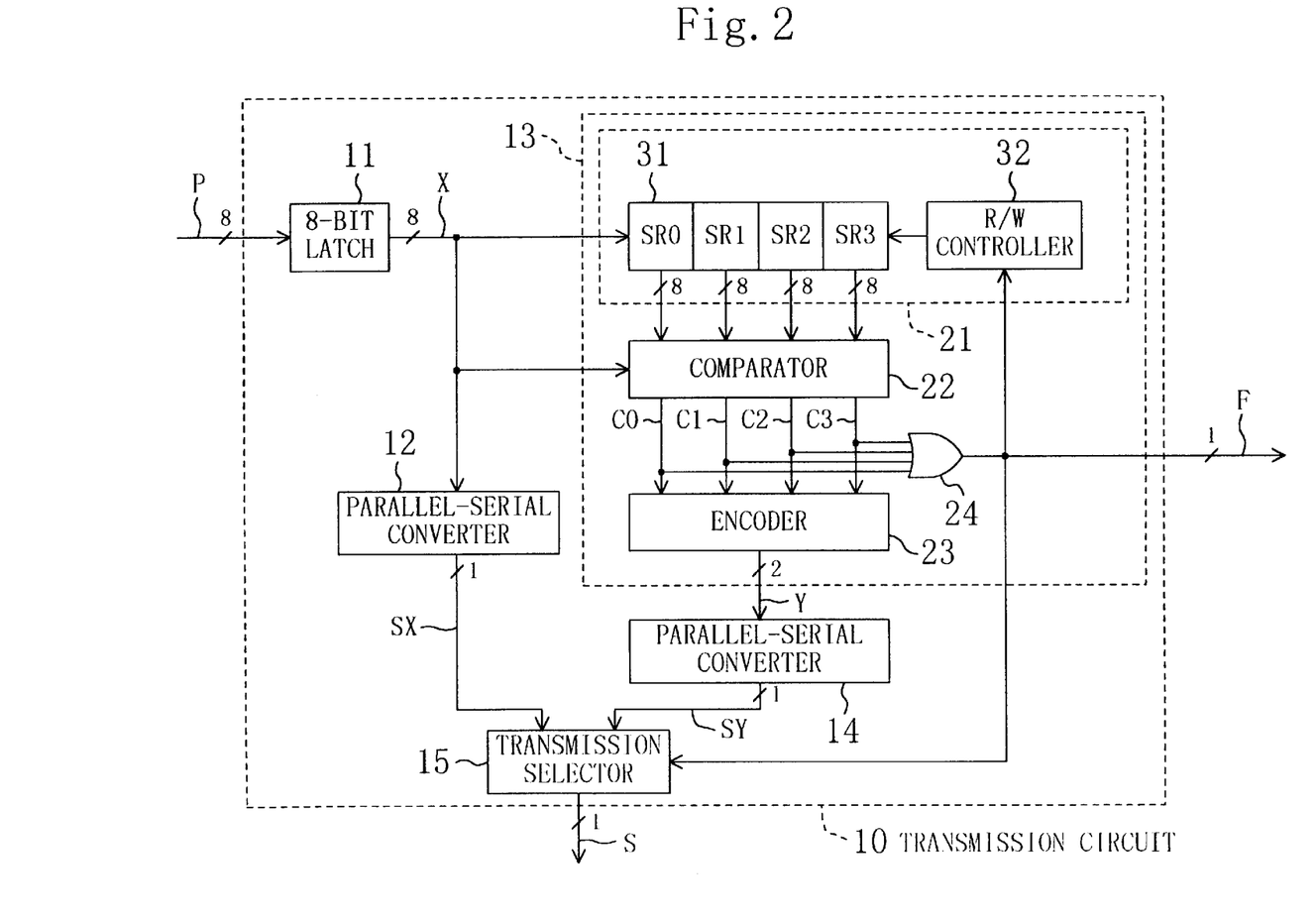
FIG. 2 is a block diagram illustrating an example structure of a transmission circuit of the present invention.

FIG. 2 shows an internal structure of the transmission circuit 10 of FIG. 1. Referring to FIG. 2, the transmission circuit 10 has (a) an 8-bit latch 11 for latching an 8-bit source parallel signal P from the inside of the memory 200 and providing the 8-bit source parallel signal P as a latched source parallel signal X, (b) a first parallel-serial converter 12 for converting the source parallel signal X into a first serial signal SX, (c) an encode circuit 13, which makes an attempt to generate a coded parallel signal Y of two bits representative of the relationship between one parallel signal that has already been transmission-processed and the source parallel signal X, for generating a flag signal F of one bit, the flag signal F providing an indication of the presence of an encoding if such an attempt was successful and otherwise (that is, if the attempt was unsuccessful) providing an indication of the absence of an encoding, (d) a second parallel-serial converter 14 for converting the coded parallel signal Y into a second serial signal SY, and (e) a transmission selector 15 for selecting, as a serial signal S to be transmitted, the first serial signal SX if the flag signal F is indicative of the absence of an encoding (F=0) and selecting, as a serial signal S to be transmitted, the second serial signal SY if the flag signal F is indicative of the presence of an encoding (F=1). The serial signal S is sent to the reception circuit 110 of the CPU 300, together with the flag signal F generated in the encode circuit 13.

The encode circuit 13 of FIG. 2 has a reference table 21 for the storage of four parallel signals that have already been transmission-processed, a comparator 22 for the comparison of each of the four parallel signals stored in the reference table 21 with the source parallel signal X, an encoder 23 for the provision of the 2-bit coded parallel signal Y, and a logical circuit 24 for the provision of the 1-bit flag signal F. The reference table 21 has a shift register 31 made up of registers SR0–SR3 disposed at respective stages, and a read/write (R/W) controller 32 for controlling the read/write operations of the shift register 31. The R/W controller 32 is configured such that the shift register 31 stores four different 8-bit parallel signals that have already been transmission-processed. In other words, by virtue of the R/W controller 32, when the first serial signal SX corresponding to the source parallel signal X (=P) is selected by the transmission selector 15 (i.e. only when the flag signal F provides an indication of the absence of an encoding (F=0)), the source parallel signal X is written into the first-stage register SR0 of the shift register 31. The comparator 22 compares each of the parallel signals stored in the registers SR0–SR3 with the source parallel signal X. If the comparator 22 finds a match between the parallel signal stored in the register SR0 and the source parallel signal X, then a correspondence signal C0 is set to 1. If a match is found between the parallel signal stored in the register SR1 and the source parallel signal X, then a correspondence signal C1 is set to 1. If a match is found between the parallel signal stored in the register SR2 and the source parallel signal X, then a correspondence signal C2 is set to 1. If a match is found between the parallel signal stored in the register SR3 and the source parallel signal X, then a correspondence signal C3 is set to 1. In other words, each correspondence signal C0–C3 indicates the storage location of a parallel signal of the four parallel signals stored in the reference table 21 corresponding to the source parallel signal X. However, if no match exists between any one of the four parallel signals stored in the reference table 21 and the source parallel signal X, then all the correspondence signals C0–C3 are 0. The encoder 23 converts the correspondence signals C0–C3 into a 2-bit coded parallel signal Y. If (C0, C1, C2, C3)=(1, 0, 0, 0), then Y=(0, 0). If (C0, C1, C2, C3)=(0, 1, 0, 0), then Y=(0, 1). If (C0, C1, C2, C3)=(0, 0, 1, 0), then Y=(1, 0). If (C0, C1, C2, C3)=(0, 0, 0, 1), then Y=(1, 1). The logical circuit 24, disposed for the provision of a logical sum of the correspondence signals C0–C3 as a flag signal F, determines the logical value of the flag signal F such that the flag signal F provides an indication of the presence of an encoding (F=1) if there exists a parallel signal in the reference table 21 corresponding to the source parallel signal X and otherwise provides an indication of the absence of an encoding (F=0).

In accordance with the transmission circuit 10 of FIG. 2, if the transmission circuit 10, at the time when the shift register 31 is in the empty state, receives an 8-bit source parallel signal P, then the flag signal F becomes 0. The result of the parallel-serial conversion of the 8-bit source parallel signal X (=P) is sent as a serial signal S and the source parallel signal X is recorded in the shift register 31 as a transmission history. In this way, the record of transmission histories is gradually accumulated. If an encoding is performed with success (F=1), it is not the result of the parallel-serial conversion of the 8-bit source parallel signal X but the result of the parallel-serial conversion of the 2-bit coded parallel signal Y that is sent as a serial signal S. Therefore, the amount of information transferable per unit time in the present invention is four times that of a conventional technique for the same clock rate. Even when the clock rate is reduced by half, the transfer rate of information in the present invention is twice that of the conventional technique. On the other hand, when an encoding is performed with failure (F=0), the result of the parallel-serial conversion of the source parallel signal X is sent as a serial signal S. This makes it possible to assure, at the worst, the same information transfer rate as the conventional technique. Additionally, as long as there exists a match between the parallel signal stored in the register SR0 and the source parallel signal X, the coded parallel signal Y is 00. This provides a convenient situation that the BTP (bit transition probability) of the serial signal S is reduced to 0. It may be arranged such that the comparator 22 sets the value of the correspondence signal C0 at 1, not only when there exists a perfect match between the parallel signal stored in the register SR0 and the source parallel signal X, but also when there exists an approximate match between these signals. The same is applied to the remaining correspondence signals C1–C3.

Figure 3:
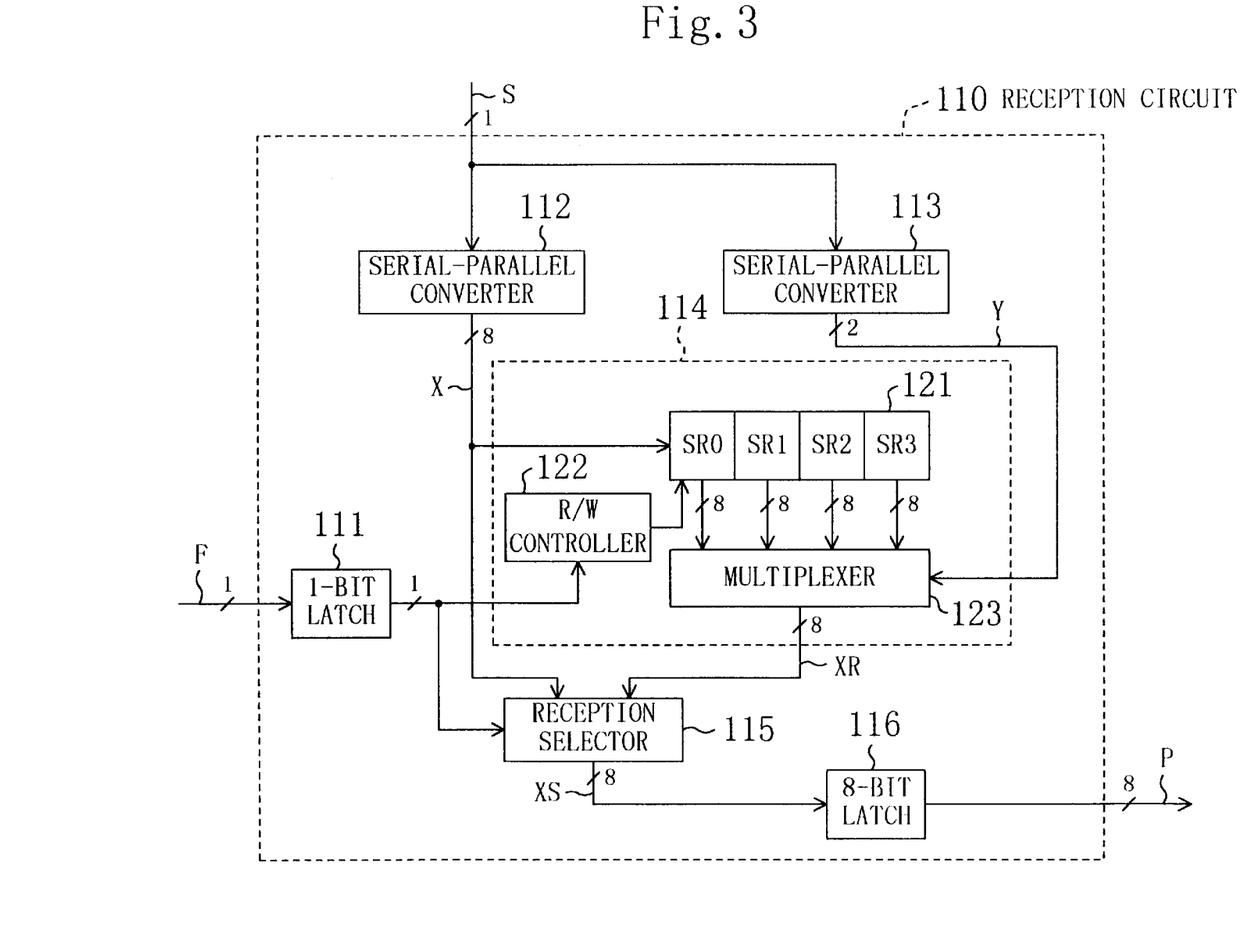
FIG. 3 is a block diagram illustrating an example structure of a reception circuit of the present invention corresponding to the transmission circuit of FIG. 2.

FIG. 3 shows an internal structure of the reception circuit 110 of FIG. 1 corresponding to that of the transmission circuit 10 of FIG. 2. Referring to FIG. 3, the reception circuit 110 has a 1-bit latch 111 for receiving and latching a flag signal F, a first serial-parallel converter 112 for converting a serial signal S, which was received together with a flag signal F indicative of the absence of an encoding (F=0), into an 8-bit source parallel signal X, a second serial-parallel converter 113 for converting a serial signal S, which was received together with a flag signal F indicative of the presence of an encoding (F=1), into a 2-bit coded parallel signal Y, a decode circuit 114 for generating an 8-bit regenerated parallel signal XR from the coded parallel signal Y by making reference to reception histories, a reception selector 115 for selecting, as a parallel signal XS selected, the source parallel signal X if the flag signal F is indicative of the absence of an encoding (F=0) and selecting, as a selected parallel signal XS, the regenerated parallel signal XR if the flag signal F is indicative of the presence of an encoding (F=1), and an 8-bit latch 116 for latching the selected parallel signal XS and providing it to the inside of the CPU 300 as a latched source parallel signal P.

The decode circuit 114 of FIG. 3 has a shift register 121 made up of registers SR0–SR3 disposed at respective stages so as to store parallel signals representative of reception processing results, a R/W controller 122 for controlling the read/write operations of the shift register 121, and a multiplexer 123 for selecting, from among the four parallel signals stored in the shift register 121, a parallel signal at a storage location designated by the 2-bit coded parallel signal Y as the regenerated parallel signal XR. The R/W controller 122 is configured such that the shift register 121 stores four different 8-bit parallel signals representing respective reception processing results. In other words, by virtue of the R/W controller 122, when the source parallel signal X is selected by the reception selector 115 (i.e. only when the flag signal F provides an indication of the absence of an encoding (F=0)), the source parallel signal X is written into the first-stage register SR0 of the shift register 121. The multiplexer 123 selects, as the regenerated parallel signal XR, either the parallel signal stored in the register SR0 if Y=(0, 0), the parallel signal stored in the register SR1 if Y=(0, 1), the parallel signal stored in the register SR2 if Y=(1, 0), or the parallel signal stored in the register SR3 if Y=(1, 1).

In accordance with the reception circuit 110 of FIG. 3, if the reception circuit 110, at the time when the shift register 121 is in the empty state, receives a serial signal S together with a flag signal F indicative of the absence of an encoding, then an 8-bit source parallel signal X (=XS=P), i.e., the result of the serial-parallel conversion of the serial signal S, is obtained, and in addition, the source parallel signal X is recorded in the shift register 121 as a reception history. In this way, the record of reception histories is gradually accumulated. The record of reception histories accumulated in the shift register 121 always corresponds to the record of transmission histories accumulated in the shift register 31 of the transmission circuit 10 of FIG. 2. Accordingly, it is possible to transfer information without inconsistency when the flag signal F indicates the presence of an encoding (F=1).

In many cases, there exists periodicity in 1-frame image data. The combination of the transmission circuit 10 of FIG. 2 and the reception circuit 110 of FIG. 3 is for compressing transfer information by making use of such periodicity. If chrominance data of a plurality of pixels are collectively sent after luminance data of the plurality of pixels are collectively sent instead of sequentially sending luminance and chrominance data of one pixel and luminance and chrominance data of the next pixel, this increases the success probability of encoding. There exists periodicity also in audio data in many cases, and the aforesaid combination can be applied to the transmission of audio data. Additionally, such a combination can be applied also to the transmission of addresses from the CPU 300 to the memory 200.

What is required by parallel signal processing in units of 64 bits in each of the memory 200 and the CPU 300 is just to add seven transmission circuits 10 and seven reception circuits 110. The number of bits of the source parallel signal P may be changed. The number of parallel signals which are recorded as transmission and reception histories in FIGS. 2 and 3 can be changed, and according to this, the number of bits of the coded parallel signal Y is changed.

Figure 4:
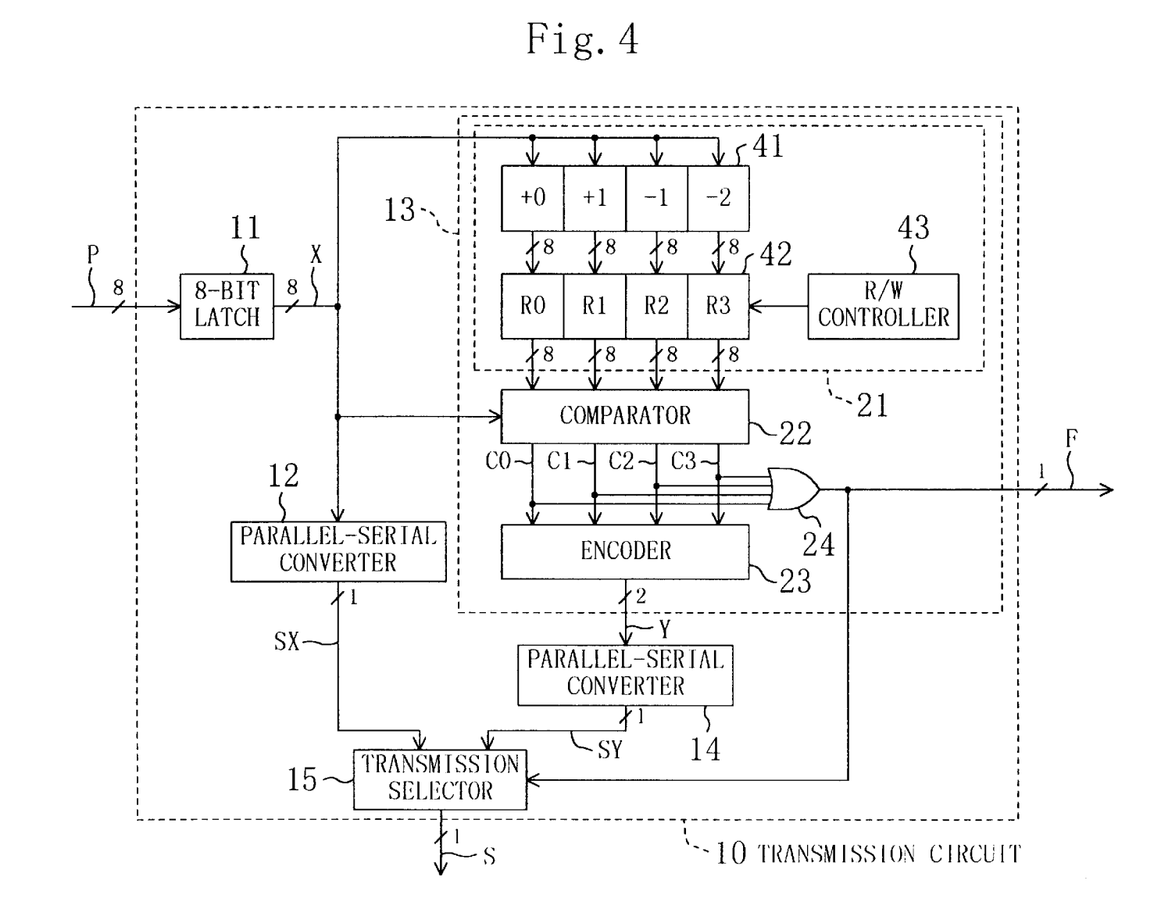
FIG. 4 is a block diagram illustrating an example structure of another transmission circuit of the present invention.

FIG. 4 shows another example structure of the transmission circuit in accordance with the present invention. The structure of FIG. 4 is characterized in that the reference table 21 of FIG. 4 has an internal structure different from that of the reference table 21 of FIG. 2. The structure of FIG. 4 is suitable for the transmission of data that gradually increase or decrease. The reference table 21 of FIG. 4 has an arithmetic unit 41 for performing, at the time when a source parallel signal X is transmission processed, four types of arithmetic operations (+0 addition, +1 addition, −1 addition, and −2 addition) on the transmission-processed source parallel signal X, a register 42 made up of four partial registers R0–R3 for storing four 8-bit parallel signals representing the results of the four different arithmetic operations of the arithmetic unit 41, and a R/W controller 43 for controlling the read/write operations of the register 42. Each of the parallel signals stored in the register 42 is compared with a new source parallel signal X in the comparator 22. The R/W controller 43 is configured so as to always update the register 42 every time the transmission processing of the source parallel signal X is completed.

In accordance with the transmission circuit 10 of FIG. 4, if the transmission circuit 10, at the time when the register 42 is in the empty state, receives an 8-bit source parallel signal P, the flag signal F becomes 0. Accordingly, the result of the parallel-serial conversion of an 8-bit source parallel signal X (=P) is sent as a serial signal S and each of four arithmetic results relating to the source parallel signal X (X+0, X+1, X−1, and X−2) is recorded in the register 42 as a transmission prediction. When a new source parallel signal P is provided, a new source parallel signal X equal to the new source parallel signal P is compared with each of the aforesaid four arithmetic results each recorded as a transmission prediction in the register 42 (i.e., X+0, X+1, X−1, and X−2) by the comparator 22. At this time, as long as the value represented by the new source parallel signal X is equal to or in the vicinity of the value represented by the previous source parallel signal X, any one of the correspondence signals C0–C3 is set to 1. As in the case of FIG. 2, the 2-bit coded parallel signal Y and the 1-bit flag signal F are generated based on the correspondence signals C0–C3 indicating the storage location of a parallel signal of the four parallel signals stored in the reference table 21 corresponding to the source parallel signal X. The coded parallel signal Y indicates the variation direction and amount of the source parallel signal X. If an encoding is performed successfully in this way (F=1), not the result of the parallel-serial conversion of an 8-bit source parallel signal X but the result of the parallel-serial conversion of a 2-bit coded parallel signal Y is sent as a serial signal S. Therefore, the amount of information transferable per unit time in the present invention is four times that of a conventional technique for the same clock rate. If an encoding is performed with failure (F=0), the result of the parallel-serial conversion of a source parallel signal X is sent as a serial signal S. This makes it possible to assure, at the worst, the same information transfer rate as the conventional technique. Additionally, as long as there exists a match between the parallel signal stored in the register R0 and the source parallel signal X, the coded parallel signal Y is 00. This provides a convenient situation that the BTP (bit transition probability) of the serial signal S is reduced to 0.

Figure 5:
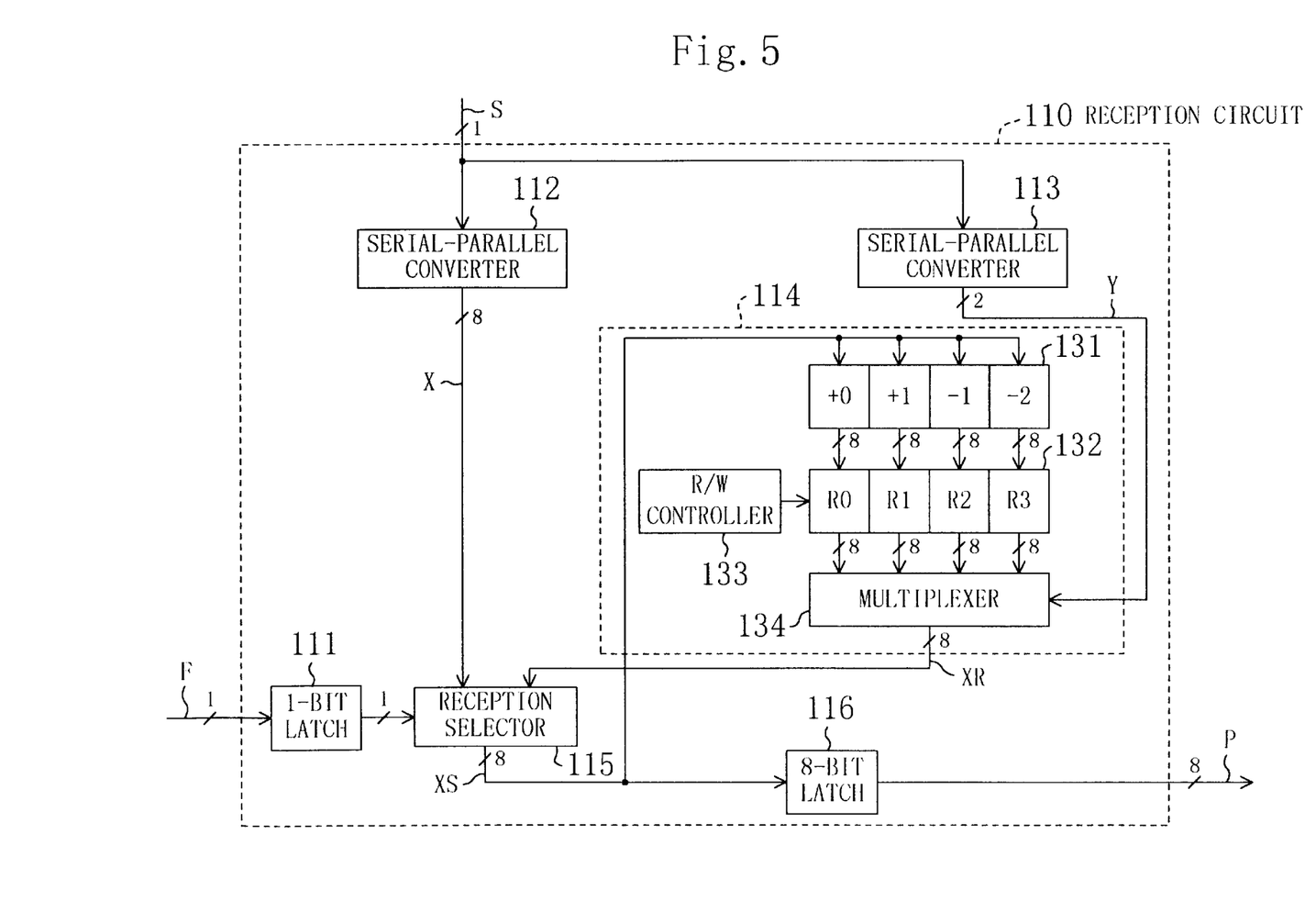
FIG. 5 is a block diagram illustrating an example structure of another reception circuit of the present invention corresponding to the transmission circuit of FIG. 4.

FIG. 5 shows an example structure of a reception circuit corresponding to the transmission circuit 10 of FIG. 4. The structure of FIG. 5 is characterized in that the decode circuit 114 of FIG. 5 has an internal structure different from that of the decode circuit 114 of FIG. 3. The decode circuit 114 of FIG. 5 has an arithmetic unit 131 for performing the same four types of arithmetic operations that the arithmetic unit 41 of FIG. 4 does (+0 addition, +1 addition, −1 addition, and −2 addition) on a parallel signal XS selected, the selected parallel signal XS representing the result of the reception processing of a serial signal S, a register 132 made up of four partial registers R0–R3 for storing four 8-bit parallel signals representative of arithmetic results of the arithmetic unit 131, a R/W controller 133 for controlling the read/write operations of the register 132, and a multiplexer 134 for selecting, from among the four parallel signals stored in the register 132, a parallel signal at a storage location designated by the foregoing 2-bit coded parallel signal Y as a regenerated parallel signal XR. The R/W controller 133 is configured so as to always update the register 132 every time the reception processing of the serial signal S is completed. The multiplexer 134 selects, as a regenerated parallel signal XR, either the parallel signal stored in the register R0 if Y=(0, 0), the parallel signal stored in the register R1 if Y=(0, 1), the parallel signal stored in the register R2 if Y=(1, 0), or the parallel signal stored in the register R3 if Y=(1, 1).

In accordance with the reception circuit 110 of FIG. 5, if the reception circuit 110, at the time when the register 132 is in the empty state, receives a serial signal S together with a flag signal F indicative of the absence of an encoding (F=0), an 8-bit source parallel signal X (=XS=P), which is the result of the serial-parallel conversion of the serial signal S, is obtained, and in addition, each of four arithmetic results relating to the source parallel signal X (X+0, X+1, X−1, and X−2) is recorded in the register 132 as a reception prediction. These reception predictions always correspond to the transmission predictions recorded in the register 42 of the transmission circuit 10 of FIG. 4. Therefore, it is possible to transfer information without inconsistency when the flag signal F is indicative of the presence of an encoding (F=1).

The combination of the transmission circuit 10 of FIG. 4 and the reception circuit 110 of FIG. 5 can be applied to the transmission of addresses which gradually increase or decrease (for example, the transmission of addresses from the CPU 300 to the memory 200). In other words, an address signal supplied from a program counter in the CPU 300 is provided to the transmission circuit 10 as a source parallel signal P. The transmission circuit 10 first sends, along with a flag signal F providing an indication of the absence of an encoding (F=0), the result of the parallel-serial conversion of the address signal. Thereafter, as long as the address variation is +0, +1, −1, or −2, a high-speed address information transfer, which uses the parallel-serial conversion result of the 2-bit coded parallel signal Y, can be performed. Suppose here that the number of pixels forming one line of an image is represented by N. In this case, it is possible to speed up the address transmission of adjacent pixels located on the upper, lower, right, and left sides of a specific pixel by making a change in the type of arithmetic operation in the arithmetic unit 41 of FIG. 4 and the arithmetic unit 131 of FIG. 5 to +1 addition, +N addition, −1 addition, and −N addition operations. In the reception circuit 110 of FIG. 5, it may be possible to automatically generate from a pixel address latched in the 8-bit latch 116 an arbitrary number of addresses.

In the combination of the transmission circuit 10 of FIG. 4 and the reception circuit 110 of FIG. 5, the number of bits forming the source parallel signal P may be changed. The type of arithmetic operation and the number of arithmetic operations in the arithmetic unit 41 of FIG. 4 and the arithmetic unit 131 of FIG. 5 are arbitrary. The type of arithmetic operation may include inversion, shift, and the like arithmetic operations. If there is made a change in the number of arithmetic operations, this correspondingly changes the number of bits forming the coded parallel signal Y.

It is possible to switch between the reference table 21 of FIG. 2 and the reference table 21 of FIG. 4 according to one additional bit. Such an additional bit is sent along with the flag signal F and the decode circuit 114 of FIG. 3 and the decode circuit 114 of FIG. 5 are switched according to the additional bit.

Figure 6:
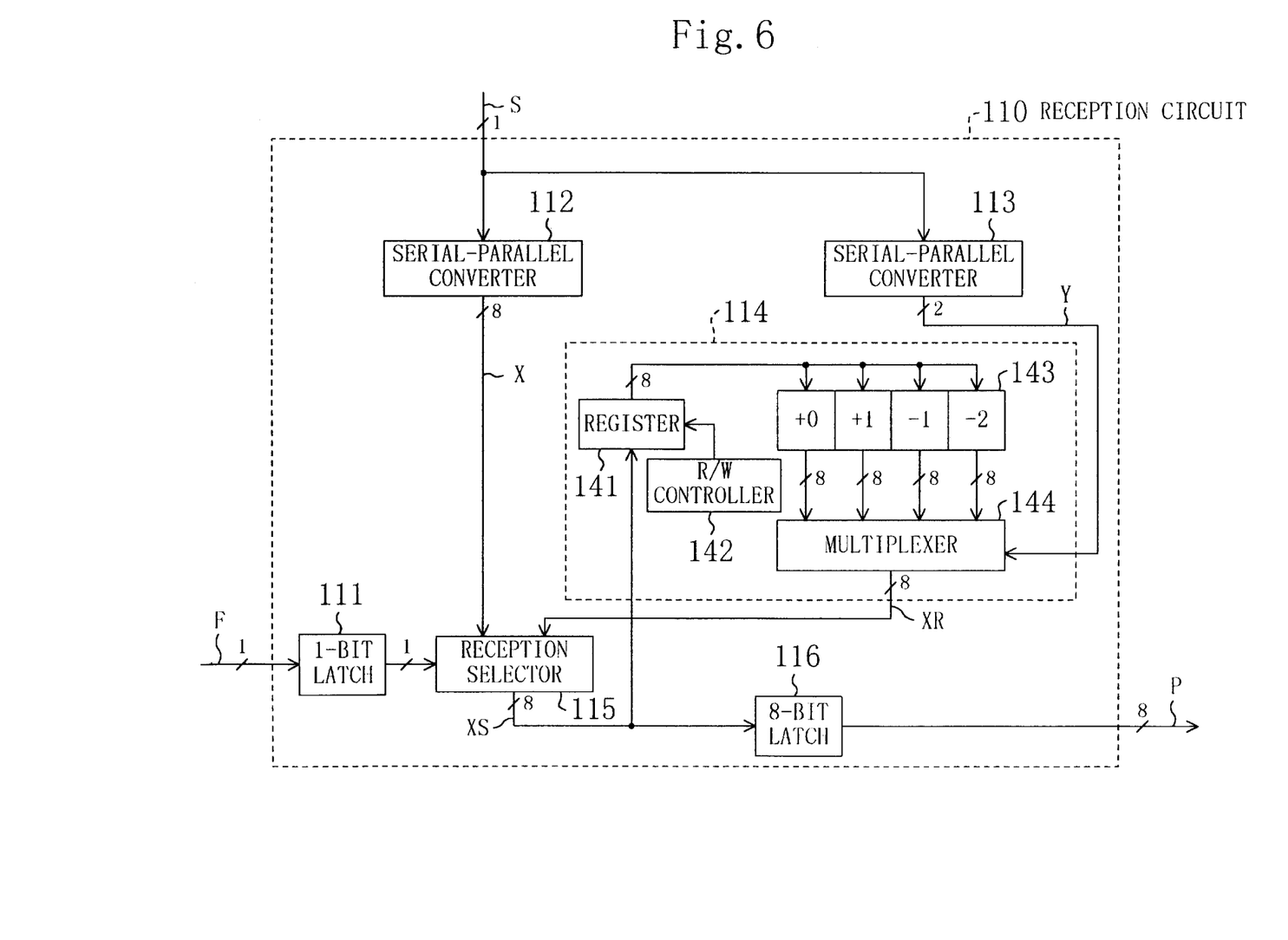
FIG. 6 is a block diagram illustrating a variation of the reception circuit of FIG. 5.

FIG. 6 shows a variation of the reception circuit 110 of FIG. 5. In accordance with the structure of FIG. 6, instead of a plurality of parallel signals each serving as a reception prediction, a single parallel signal that is the origin of the plurality of parallel signals is left as a record. The decode circuit 114 of FIG. 6 has a register 141 for storing a parallel signal XS selected, the selected parallel signal XS representing the result of the reception processing of a serial signal S, a R/W controller 142 for controlling the read/write operations of the register 141, an arithmetic unit 143 made up of +0, +−1, −1, and −2 adders for performing the same four types of arithmetic operations that the arithmetic unit 41 of FIG. 4 does (+0 addition, +1 addition, −1 addition, and −2 addition) on the selected parallel signal XS, and a multiplexer 144 for selecting, from among four parallel signals generated by the adders of the arithmetic unit 143 and representing respective arithmetic results of the arithmetic unit 143, a parallel signal at a storage location designated by the aforesaid 2-bit coded parallel signal Y as the 8-bit regenerated parallel signal XR. The R/W controller 142 is configured so as to always update the register 141 every time the reception processing of the serial signal S is completed. The multiplexer 144 selects, as a regenerated parallel signal XR, either the parallel signal from the +0 adder if Y (0, 0), the parallel signal from the +1 adder if Y=(0, 1), the parallel signal from the −1 adder if Y=(1, 0), or the parallel signal from the −2 adder if Y=(1, 1). The reception circuit 110 of FIG. 6 can perform the same operations as the reception circuit 110 of FIG. 5.

Figure 7:
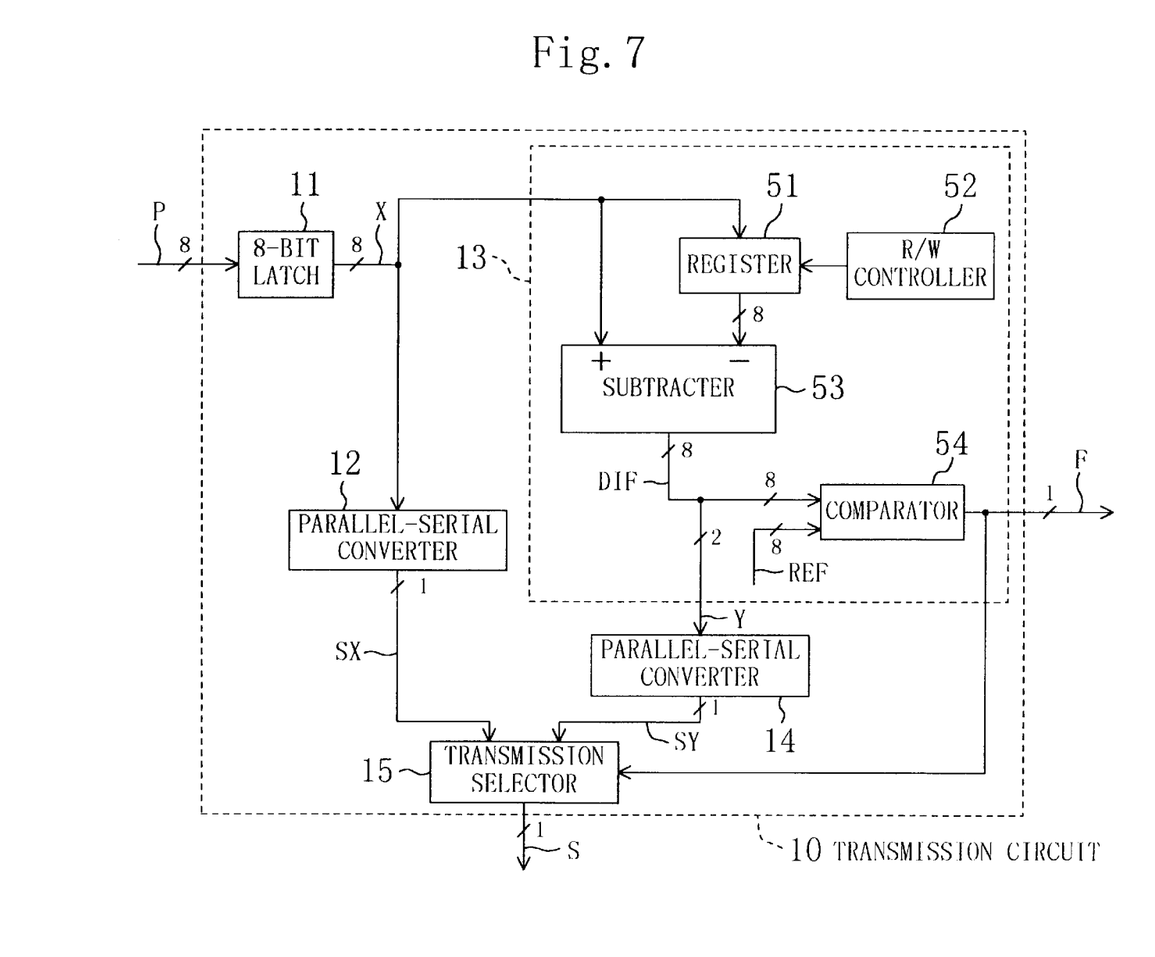
FIG. 7 is a block diagram illustrating an example structure of still another transmission circuit of the present invention.

FIG. 7 shows still another example structure of the transmission circuit in accordance with the present invention. The structure of FIG. 7 is characterized in that the encode circuit 13 of FIG. 7 has an internal structure different from that of the encode circuit 13 of FIG. 2. The structure of FIG. 7 is suitable for the transmission of data which gradually increase or degrease. The encode circuit 13 of FIG. 7 has a register 51 for storing, at the time when the transmission processing of a source parallel signal X is completed, the source parallel signal X, a R/W controller 52 for controlling the read/write operations of the register 51, a subtracter 53 for generating a signal DIF of eight bits representing the difference between a new source parallel signal X and the previous source parallel signal X stored in the register 51 and providing the two least significant bits of the 8-bit signal DIF as a coded parallel signal Y, and a comparator 54 for determining the logical value of a flag signal F in such a way that the flag signal F provides an indication of the presence of an encoding (F=1) if the aforesaid difference represented by the signal DIF falls in a predetermined range defined by a reference signal REF and otherwise provides an indication of the absence of an encoding (F=0). The R/W controller 52 is configured so as to always update the register 51 every time the transmission processing of the source parallel signal X is completed.

In accordance with the transmission circuit 10 of FIG. 7, if the transmission circuit 10, at the time when the register 51 is in the empty state, receives an 8-bit source parallel signal P, then the result of the parallel-serial conversion of an 8-bit source parallel signal X (=P) is sent as a serial signal S and in addition, the source parallel signal X is recorded in the register 51 as a transmission history. Upon the receipt of a new source parallel signal P, the subtracter 53 generates a signal DIF representing the difference between a new source parallel signal X equal to the received new source parallel signal P and the previous source parallel signal X stored as a transmission history in the register 51. At this time, as long as the new source parallel signal X carries a value equal to or in the vicinity of the value represented by the previous source parallel signal X, all of the six most significant bits of the difference signal DIF are either 000000 or 111111 and the flag signal F is set to 1. As a result, the 2-bit coded parallel signal Y becomes valid. In other words, if DIF=+1, then Y=(0, 1). If DIF=+0, then Y=(0, 0). If DIF=−1, then Y=(1, 1). If DIF=−2, then Y=(1, 0). If, in this way, an encoding is performed with success (F=1), not the result of the parallel-serial conversion of an 8-bit source parallel signal X, but the result of the parallel-serial conversion of a 2-bit coded parallel signal Y is sent as a serial signal S. Therefore, the amount of information transferable per unit time in the present invention is four times that of a conventional technique for the same clock rate. In the case an encoding is performed with failure (F=0), the result of the parallel-serial conversion of a source parallel signal X is sent as a serial signal S, which makes it possible to assure, at the worst, the same information transfer rate as the conventional technique. Additionally, as long as there exists a match between the parallel signal stored in the register 51 and the source parallel signal X, the coded parallel signal Y is 00. This provides a convenient situation that the BTP (bit transition probability) of the serial signal S is reduced to 0.

Figure 8:
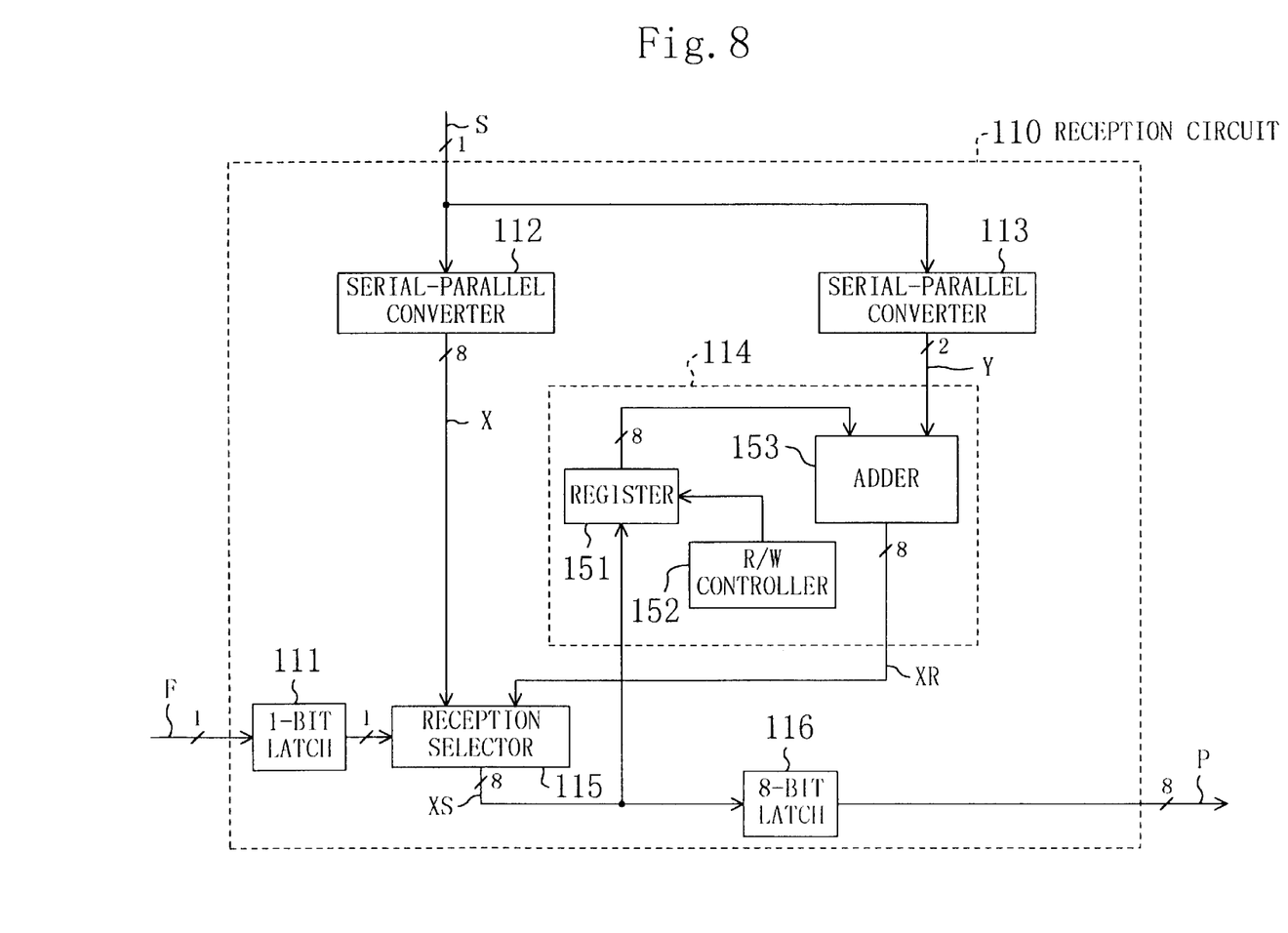
FIG. 8 is a block diagram illustrating an example structure of still another reception circuit of the present invention corresponding to the transmission circuit of FIG. 7.

FIG. 8 shows an example structure of a reception circuit corresponding to the transmission circuit 10 of FIG. 7. The structure of FIG. 8 is characterized in that the decode circuit 114 of FIG. 8 has an internal structure different from that of the decode circuit 114 of FIG. 3. The decode circuit 114 of FIG. 8 has a register 151 for storing a parallel signal XS selected, the selected parallel signal XS representing the result of the reception processing of a serial signal S, a R/W controller 152 for controlling the read/write operations of the register 151, and an adder 153 for generating a signal representing a result of summing together a parallel signal stored in the register 151 and the result of the sign extension of a 2-bit coded parallel signal Y and for providing a signal representative of the sum result as an 8-bit regenerated parallel signal XR. The R/W controller 152 is configured so as to always update the register 151 every time the reception processing of the serial signal S is completed.

In accordance with the reception circuit 110 of FIG. 8, if the reception circuit 110, at the time when the register 151 is in the empty state, receives a serial signal S along with a flag signal F indicating the absence of an encoding (F=0), an 8-bit source parallel signal X (=XS=P) as a result of the serial-parallel conversion of the serial signal S is obtained and in addition, the source parallel signal X is recorded in the register 151 as a reception history. Such a reception history always corresponds to the transmission history recorded in the register 51 of the transmission circuit 10 of FIG. 7. Therefore, it is possible to transfer information without inconsistency when the flag signal F indicates the presence of an encoding (F=1).

The combination of the transmission circuit 10 of FIG. 7 and the reception circuit 110 of FIG. 8 can be applied to the transmission of addresses that gradually increase or decrease. The number of bits forming the source parallel signal P can be changed. The number of bits forming the coded parallel signal Y can be changed.

The above-described transmission and reception circuits of the present invention can find applications not only in the transfer of information between a CPU and a memory but also in the transmission of data signals, address signals, and other control signals between any ones of semiconductor integrated circuits that perform internal handling of parallel signals.

What is claimed is:

1. A transmission circuit, disposed in a first semiconductor integrated circuit, for the achievement of information transfer by means of a serial signal between said first semiconductor integrated circuit and a second semiconductor integrated circuit, each of said first and second semiconductor integrated circuits performing internal handling of parallel signals, said transmission circuit comprising:
(a) input means for receiving a source parallel signal from the inside of said first semiconductor integrated circuit,
(b) first conversion means for converting said source parallel signal into a first serial signal,
(c) encode means for making an attempt to generate a coded parallel signal which represents the relationship between one parallel signal which has already been transmission processed and said source parallel signal and which contains therein adjacent bits identical in value with each other, and generating a flag signal which provides an indication of the presence of an encoding if said attempt was successful and which otherwise provides an indication of the absence of an encoding,
(d) second conversion means for converting said coded parallel signal into a second serial signal, and
(e) transmission selection means for selecting said first serial signal if said flag signal is indicative of the absence of an encoding, and selecting said second serial signal if said flag signal is indicative of the presence of an encoding, whereby said first serial signal or said second serial signal, whichever was selected by said transmission selection means, is transmitted to said second semiconductor integrated circuit, together with said flag signal generated in said encode means.

2. The transmission circuit as defined in claim 1, said encode means including:
(a) a register for storing a plurality of parallel signals that have already been transmission processed,
(b) a comparator for comparing each of said plurality of parallel signals stored in said register with said source parallel signal,
(c) an encoder for converting, according to a comparison result yielded by said comparator, a signal which specifies the storage location of a parallel signal of said plurality of parallel signals stored in said register corresponding to said source parallel signal, into said coded parallel signal, and
(d) a logical circuit for determining, according to a comparison result yielded by said comparator, the logical value of said flag signal so that said flag signal provides an indication of the presence of an encoding if there exists a match between a parallel signal of said plurality of parallel signals stored in said register and said source parallel signal and otherwise provides an indication of the absence of an encoding.

3. The transmission circuit as defined in claim 2, wherein said register is a shift register, and wherein for said shift register to store a plurality of different parallel signals that have already been transmission processed, said encode means further includes a controller for providing control so that only when said first serial signal corresponding to said source parallel signal is selected by said transmission selection means, said source parallel signal is written to said shift register.

4. The transmission circuit as defined in claim 1, said encode means including:
(a) an arithmetic unit for performing various arithmetical operations on one parallel signal that has already been transmission processed,
(b) a register for storing a plurality of parallel signals representative of respective arithmetical operation results yielded by said arithmetic unit,
(c) a comparator for comparing each of said plurality of parallel signals stored in said register with said source parallel signal,
(d) an encoder for converting, according to a comparison result yielded by said comparator, a signal which specifies the storage location of a parallel signal of said plurality of parallel signals stored in said register corresponding to said source parallel signal, into said coded parallel signal, and
(e) a logical circuit for determining, according to a comparison result yielded by said comparator, the logical value of said flag signal so that said flag signal provides an indication of the presence of an encoding if there exists a match between a parallel signal of said plurality of parallel signals stored in said register and said source parallel signal and otherwise provides an indication of the absence of an encoding.

5. The transmission circuit as defined in claim 1, said encode means including:
(a) a register for storing one parallel signal that has already been transmission processed,
(b) a subtracter for generating a signal representative of the difference between said source parallel signal and said parallel signal stored in said register, and providing a predetermined number of least significant bits of all bits of said difference-representing signal as said coded parallel signal, and
(c) a comparator for determining the logical value of said flag signal so that said flag signal provides an indication of the presence of an encoding if the difference represented by said difference-representing signal generated in said subtracter falls in a predetermined range and otherwise provides an indication of the absence of an encoding.

6. A reception circuit which is disposed, for the achievement of information transfer by means of a serial signal between first and second semiconductor integrated circuits each performing internal handling of parallel signals, in said second semiconductor integrated circuit so as to receive from said first semiconductor integrated circuit said serial signal together with a flag signal which provides an indication of the presence or absence of an encoding of said serial signal, said reception circuit comprising:
(a) first conversion means for converting said serial signal received together with said flag signal indicative of the absence of an encoding, into a source parallel signal,
(b) second conversion means for converting said serial signal received together with said flag signal indicative of the presence of an encoding, into a coded parallel signal having adjacent bits identical in value with each other, (c) decode means for generating from said coded parallel signal a regenerated parallel signal, (d) reception selection means for selecting said source parallel signal if said flag signal is indicative of the absence of an encoding, and selecting said regenerated parallel signal if said flag signal is indicative of the presence of an encoding, and (e) output means for providing said source parallel signal or said regenerated parallel signal, whichever was selected by said reception selection means, to the inside of said second semiconductor integrated circuit.

7. The reception circuit as defined in claim 6, said decode means including:

(a) a register for storing a plurality of parallel signals representative of respective reception processing results, and (b) a multiplexer for selecting, from among said plurality of parallel signals stored in said register, a parallel signal at a storage location designated by said coded parallel signal, as said regenerated parallel signal.

8. The reception circuit as defined in claim 7, wherein said register is a shift register, and wherein for said shift register to store a plurality of different parallel signals representative of respective reception processing results, said decode means further includes a controller for providing control so that only when said source parallel signal is selected by said reception selection means, said source parallel signal is written to said shift register.

9. The reception circuit as defined in claim 6, said decode means including:

(a) an arithmetic unit for performing various arithmetical operations on one parallel signal representative of a reception processing result, (b) a register for storing a plurality of parallel signals representative of respective arithmetical operation results yielded by said arithmetic unit, and (c) a multiplexer for selecting, from among said plurality of parallel signals stored in said register, a parallel signal at a storage location designated by said coded parallel signal, as said regenerated parallel signal.

10. The reception circuit as defined in claim 6, said decode means including:

(a) a register for storing one parallel signal representative of a reception processing result, (b) an arithmetic unit for performing various arithmetical operations on said parallel signal stored in said register, and (c) a multiplexer for selecting, from among a plurality of parallel signals representative of respective results of said arithmetical operations by said arithmetic unit, a parallel signal at a storage location designated by said coded parallel signal, as said regenerated parallel signal.

11. The reception circuit as defined in claim 6, said decode means including:

(a) a register for storing one parallel signal representative of a reception processing result, and (b) an adder for generating a signal representative of the sum of said parallel signal stored in said register and said coded parallel signal, and providing said sum-representing signal as said regenerated parallel signal.

12. A transmission circuit, disposed in a first semiconductor integrated circuit, for the achievement of information transfer by means of a serial signal between said first semiconductor integrated circuit and a second semiconductor integrated circuit, each of said first and second semiconductor integrated circuits performing internal handling of parallel signals, said transmission circuit comprising:

(a) input means for receiving a source parallel signal from the inside of said first semiconductor integrated circuit, (b) first conversion means for converting said source parallel signal into a first serial signal, (c) encode means for making an attempt to generate a coded parallel signal which represents the relationship between one parallel signal which has already been transmission processed and said source parallel signal and which is made up of a less number of bits than said source parallel signal, and generating a flag signal which provides an indication of the presence of an encoding if said attempt was successful and which otherwise provides an indication of the absence of an encoding, (d) second conversion means for converting said coded parallel signal into a second serial signal, and (e) transmission selection means for selecting said first serial signal if said flag signal is indicative of the absence of an encoding, and selecting said second serial signal if said flag signal is indicative of the presence of an encoding, whereby said first serial signal or said second serial signal, whichever was selected by said transmission selection means, is transmitted to said second semiconductor integrated circuit, together with said flag signal generated in said encode means.

13. The transmission circuit as defined in claim 12, said encode means including:

(a) a register for storing a plurality of parallel signals that have already been transmission processed, (b) a comparator for comparing each of said plurality of parallel signals stored in said register with said source parallel signal, (c) an encoder for converting, according to a comparison result yielded by said comparator, a signal which specifies the storage location of a parallel signal of said plurality of parallel signals stored in said register corresponding to said source parallel signal, into said coded parallel signal, and (d) a logical circuit for determining, according to a comparison result yielded by said comparator, the logical value of said flag signal so that said flag signal provides an indication of the presence of an encoding if there exists a match between a parallel signal of said plurality of parallel signals stored in said register and said source parallel signal and otherwise provides an indication of the absence of an encoding.

14. The transmission circuit as defined in claim 13, wherein said register is a shift register, and wherein for said shift register to store a plurality of different parallel signals that have already been transmission processed, said encode means further includes a controller for providing control so that only when said first serial signal corresponding to said source parallel signal is selected by said transmission selection means, said source parallel signal is written to said shift register.

15. The transmission circuit as defined in claim 12, said encode means including:
(a) an arithmetic unit for performing various arithmetical operations on one parallel signal that has already been transmission processed,
(b) a register for storing a plurality of parallel signals representative of respective arithmetical operation results yielded by said arithmetic unit,
(c) a comparator for comparing each of said plurality of parallel signals stored in said register with said source parallel signal,
(d) an encoder for converting, according to a comparison result yielded by said comparator, a signal which specifies the storage location of a parallel signal of said plurality of parallel signals stored in said register corresponding to said source parallel signal, into said coded parallel signal, and
(e) a logical circuit for determining, according to a comparison result yielded by said comparator, the logical value of said flag signal so that said flag signal provides an indication of the presence of an encoding if there exists a match between a parallel signal of said plurality of parallel signals stored in said register and said source parallel signal and otherwise provides an indication of the absence of an encoding.

16. The transmission circuit as defined in claim 12, said encode means including:
(a) a register for storing one parallel signal that has already been transmission processed,
(b) a subtracter for generating a signal representative of the difference between said source parallel signal and said parallel signal stored in said register, and providing a predetermined number of least significant bits of all bits of said difference-representing signal as said coded parallel signal, and
(c) a comparator for determining the logical value of said flag signal so that said flag signal provides an indication of the presence of an encoding if the difference represented by said difference-representing signal generated in said subtracter falls in a predetermined range and otherwise provides an indication of the absence of an encoding.

17. A reception circuit which is disposed, for the achievement of information transfer by means of a serial signal between first and second semiconductor integrated circuits each performing internal handling of parallel signals, in said second semiconductor integrated circuit so as to receive from said first semiconductor integrated circuit said serial signal together with a flag signal which provides an indication of the presence or absence of an encoding of said serial signal,
said reception circuit comprising:
(a) first conversion means for converting said serial signal received together with said flag signal indicative of the absence of an encoding, into a source parallel signal,
(b) second conversion means for converting said serial signal received together with said flag signal indicative of the presence of an encoding, into a coded parallel signal made up of a less number of bits than said source parallel signal,
(c) decode means for generating from said coded parallel signal a regenerated parallel signal made up of the same number of bits as said source parallel signal,
(d) reception selection means for selecting said source parallel signal if said flag signal is indicative of the absence of an encoding, and selecting said regenerated parallel signal if said flag signal is indicative of the presence of an encoding, and
(e) output means for providing said source parallel signal or said regenerated parallel signal, whichever was selected by said reception selection means, to the inside of said second semiconductor integrated circuit.

18. The reception circuit as defined in claim 17, said decode means including:
(a) a register for storing a plurality of parallel signals representative of respective reception processing results, and
(b) a multiplexer for selecting, from among said plurality of parallel signals stored in said register, a parallel signal at a storage location designated by said coded parallel signal, as said regenerated parallel signal.

19. The reception circuit as defined in claim 18, wherein said register is a shift register, and
wherein for said shift register to store a plurality of different parallel signals representative of respective reception processing results, said decode means further includes a controller for providing control so that only when said source parallel signal is selected by said reception selection means, said source parallel signal is written to said shift register.

20. The reception circuit as defined in claim 17, said decode means including:
(a) an arithmetic unit for performing various arithmetical operations on one parallel signal representative of a reception processing result,
(b) a register for storing a plurality of parallel signals representative of respective arithmetical operation results yielded by said arithmetic unit, and
(c) a multiplexer for selecting, from among said plurality of parallel signals stored in said register, a parallel signal at a storage location designated by said coded parallel signal, as said regenerated parallel signal.

21. The reception circuit as defined in claim 17, said decode means including:
(a) a register for storing one parallel signal representative of a reception processing result,
(b) an arithmetic unit for performing various arithmetical operations on said parallel signal stored in said register, and
(c) a multiplexer for selecting, from among a plurality of parallel signals representative of respective results of said arithmetical operations by said arithmetic unit, a parallel signal at a storage location designated by said coded parallel signal, as said regenerated parallel signal.

22. The reception circuit as defined in claim 17, said decode means including:
(a) a register for storing one parallel signal representative of a reception processing result, and
(b) an adder for generating a signal representative of the sum of said parallel signal stored in said register and said coded parallel signal, and providing said sum-representing signal as said regenerated parallel signal.

* * * * *